United States Patent
Szczyrbowski et al.

(10) Patent No.: US 6,168,698 B1
(45) Date of Patent: *Jan. 2, 2001

(54) APPARATUS FOR COATING A SUBSTRATE

(75) Inventors: Joachim Szczyrbowski, Goldbach; Götz Teschner, Hanau; Anton Zmelty, Hösbach, all of (DE)

(73) Assignee: Balzers und Leybold Deutschland Holding AG, Hanau (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/736,018

(22) Filed: Oct. 22, 1996

(30) Foreign Application Priority Data

Oct. 27, 1995 (DE) .............................. 195 40 053
Oct. 28, 1995 (DE) .............................. 195 40 255

(51) Int. Cl.$^7$ .............................................. C23C 14/34
(52) U.S. Cl. ................... 204/298.25; 204/298.23; 204/298.24; 204/298.26; 204/298.07; 204/298.08; 204/298.19; 204/298.11; 204/192.12
(58) Field of Search .................... 204/298.23, 298.24, 204/298.25, 298.26, 298.07, 298.08, 298.19, 298.11, 192.12

(56) References Cited

U.S. PATENT DOCUMENTS

| | | | |
|---|---|---|---|
| 4,331,526 | 5/1982 | Kuehnle | 204/192 |
| 4,572,842 | * 2/1986 | Dietrich et al. | 204/298.07 |
| 4,608,943 | 9/1986 | Doehler et al. | 118/718 |
| 4,920,917 | 5/1990 | Nakatani et al. | 118/718 |
| 4,943,363 | 7/1990 | Zejda et al. | 204/298 |
| 4,981,566 | * 1/1991 | Wurczinger | 204/298.26 |
| 5,169,509 | * 12/1992 | Latz et al. | 204/298.07 |
| 5,340,454 | * 8/1994 | Schaefer et al. | 204/298.26 |
| 5,415,757 | * 5/1995 | Szcyrbowski et al. | 204/298.08 |
| 5,718,815 | * 2/1998 | Szczyrbowski et al. | 204/298.08 |
| 5,888,305 | * 3/1999 | Szczyrbowski et al. | 204/298.08 |

FOREIGN PATENT DOCUMENTS

| | | |
|---|---|---|
| 3300097 | 8/1983 | (DE) . |
| 3802582 | 8/1989 | (DE) . |
| 4106770 | 9/1992 | (DE) . |
| 4204999 | 8/1993 | (DE) . |
| 252205 | 12/1993 | (DE) . |

(List continued on next page.)

OTHER PUBLICATIONS

Schiller et al., Hochrate–Sputtertechnik und deren Einsatz in–verschiedenen Industriezweigen, Vakuum–Technik, 37. Jg. H. Jun./1988 S. 162–175.

Schiller et al., Verfahren und Einsatzmöglichkeiten des–Plasmatron–Hochratezerstäubens für Beschichtungsaufgaben der Elektronik, Vakuum–Technik, 30. Jg., H. 7, S. 195–207.

Kienel et al., Moderne Beschichtungstechnologien von Architektur–glas, Vakuum–Technik, 30. Jg., H. 8, S. 236–245.

*Primary Examiner*—Rodney G. McDonald
(74) *Attorney, Agent, or Firm*—Fulbright & Jaworski, LLP

(57) ABSTRACT

Power supply lines (41, 42) connect poles of an alternating current power source (43) to respective cathodes (58, 59) in compartments (32, 39), included among a plurality of adjacent compartments (32–39'), which together form a vacuum chamber (31) and which are connected to each other by a passageway (60). The two compartments (32, 39) with the cathodes (58, 59) are separated from each other by intermediate compartments (32'–38'), at least some of which are equipped with additional sputter cathodes (61–66).

3 Claims, 2 Drawing Sheets

FOREIGN PATENT DOCUMENTS

| | | |
|---|---|---|
| 4237517 | 5/1994 | (DE) . |
| 4239843 | 6/1994 | (DE) . |
| 4324683 | 11/1994 | (DE) . |
| 4326100 | 2/1995 | (DE) . |
| 0502242 | 9/1992 | (EP) . |
| 0510401 | 10/1992 | (EP) . |
| 0544107 | 6/1993 | (EP) . |
| 0647961 | 4/1995 | (EP) . |
| 1601244 | 10/1981 | (GB) . |

* cited by examiner

APPARATUS FOR COATING A SUBSTRATE

BACKGROUND OF THE INVENTION

The invention pertains to an AC sputtering apparatus for a pair of targets mounted on respective magnetron cathodes.

DD 252205 discloses a sputtering apparatus for the production of thin layers including a system of magnets and at least two electrodes carrying the material to be sputtered above the magnets. These electrodes are arranged electrically to alternate between being the cathode and the anode of a gas discharge. For this purpose, the electrodes are connected to a source of alternating, sine-wave voltage of preferably 50 Hz.

This known sputtering apparatus is said to be especially suitable for the deposition of dielectric layers by reactive sputtering. The goal of operating the apparatus at about 50 Hz is to prevent formation of tinsel at the anode and also to prevent electrical short-circuits (so-called arcs) when coating is being carried out with metal.

U.S. Pat. No. 4,943,363 discloses an apparatus for depositing a thin film by sputtering, in which the rate at which the layers of different materials are deposited can be controlled so that extremely thin layer packages can be produced, by providing at least two different types of counterelectrodes on the cathode side.

DE 35 41 621 discloses apparatus for the deposition of a metal alloy by means of HF sputtering in which two targets are driven in alternation. The targets contain the metal components of the metal alloy to be deposited but in different proportions. The substrates are for this purpose mounted on a substrate carrier, which is rotated by a drive unit during the sputtering process.

DE 38 02 852 discloses an apparatus for the coating of a substrate with two electrodes and at least one material to be sputtered, in which the substrate to be coated is mounted between and a certain distance away from the two electrodes, and in which the alternating current half-waves are selected to have essentially the same amplitudes.

DE 41 06 770 discloses a method and an apparatus for the reactive coating of a substrate with an electrically insulating material such as silicon dioxide ($SiO_2$). The apparatus includes a source of alternating current, which is connected to cathodes. The cathodes enclose magnets and are mounted in a coating chamber. The cathodes work together with targets, and each of the two ungrounded outputs of the a.c. power source is connected to one of the cathodes carrying one of the targets. The two cathodes are installed next to each other in the coating chamber in a plasma space, and each of them is approximately the same distance away from the substrate facing it. The effective value of the discharge voltage is measured by an effective voltage value measuring device connected by a line to the cathode, and the signal is sent as a direct voltage over a line to a controller. The controller drives a control valve in such a way as to adjust the flow rate of reactive gas from the tank into the distribution line so that the measured voltage agrees with the nominal voltage.

Finally, DE 42 04 999 discloses an apparatus for coating a substrate especially with nonconductive layers from electrically conductive targets in a reactive atmosphere, in which a power source is connected to the cathodes. The cathodes enclose magnets and are installed in an evacuatable coating chamber. The cathodes interact electrically with the targets. Two anodes, separated electrically from each other and from the sputtering chamber, are installed on a plane between the cathodes and the substrate. Each of the two outputs of the secondary winding of a transformer connected to a medium-frequency generator is connected to one of the cathodes by way of a power supply line. The first and second supply lines are connected to each other by a branch line, into which an oscillatory circuit, preferably a coil and a capacitor, is inserted. Each of the two supply lines is connected to the coating chamber by way of a first electric element, which adjusts the direct voltage potential with respect to ground; to the associated anode by way of a corresponding second electric element; and also to the coating chamber by way of a branch line with an inserted capacitor. A choke coil is inserted into the section of the first supply line which connects the oscillatory circuit to the second terminal of the secondary.

SUMMARY OF THE INVENTION

Whereas the known apparatuses deal with the problem of "arcing", that is, with the problem of preventing the formation of undesirable arcs and of protecting the surface of the target from the formation of insulating layers, the object of the present invention is not only to increase the stability of the sputtering process but also to make it possible to control the uniformity of the layer thicknesses. In addition, the apparatus according to a specific embodiment is also be designed in such a way that it can be conditioned extremely quickly, which means that any water which may be wetting the inside surfaces of the chambers, inserts, and targets can be efficiently removed.

According to the present invention, each of the two outputs of the a.c. power source is connected to a cathode by a power supply line, and each of the two cathodes is installed in its own, separate compartment, included among a plurality of adjacent compartments, which together form a vacuum chamber and which are connected to each other by a passageway. The two compartments holding the cathodes are either immediately adjacent to each other or are separated from each other by one or more additional compartments.

In a particular embodiment, one of the poles of the alternating current source is connected to one of the cathodes, while the other pole is connected to the other cathode, in both cases by way of power supply lines. Each of the two cathodes, furthermore, is installed in its own compartment, which is included among a plurality of adjacent compartments, which together form a vacuum chamber and which are connected to each other by a passageway. The two compartments holding the cathodes connected to the a.c. power source are separated from each other by one or more compartments, at least some of which are equipped with their own sputter cathodes.

DETAILED DESCRIPTION OF THE PREFERRED EMBODIMENTS

Figure 1:
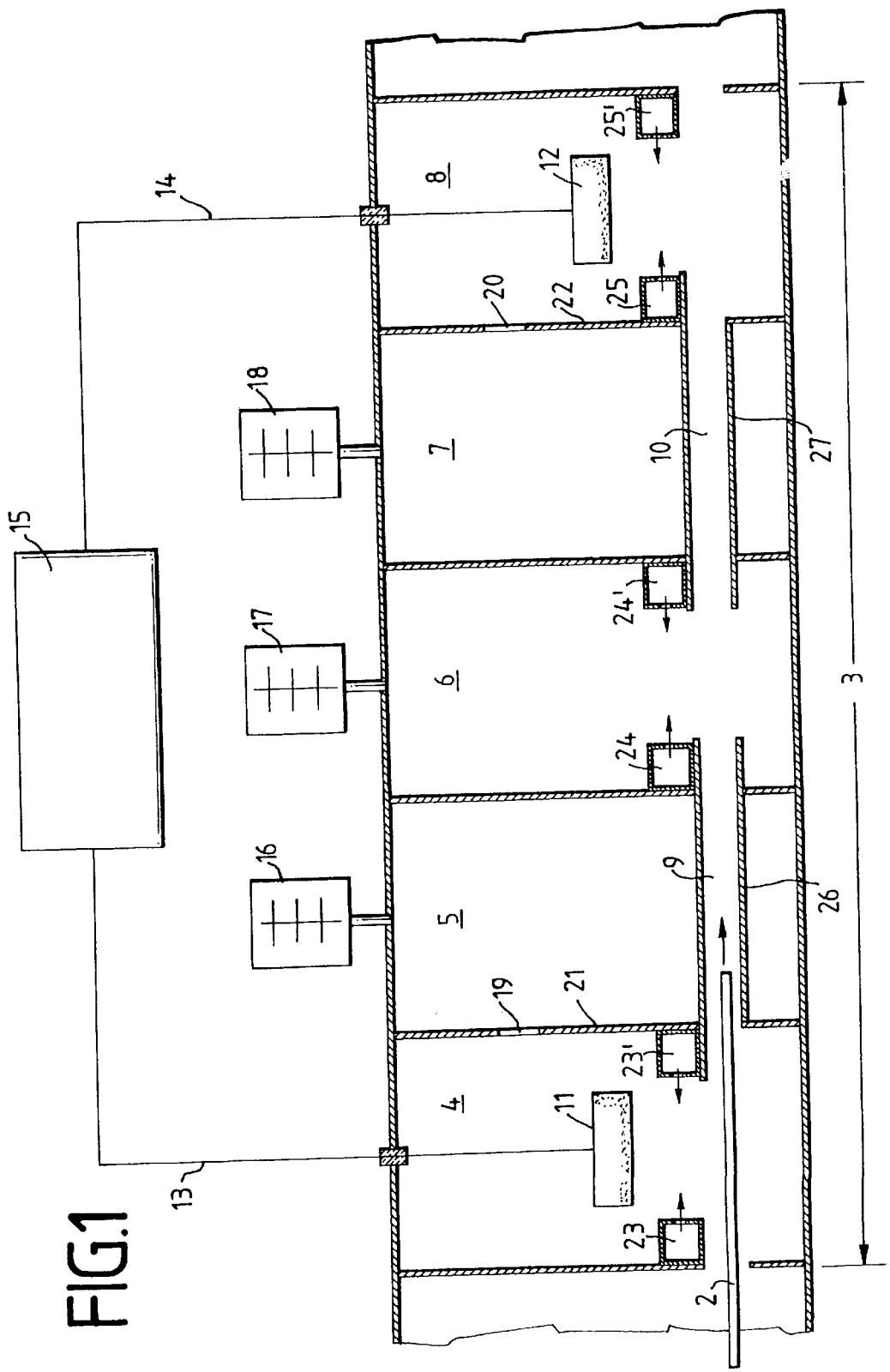
FIG. 1 is a schematic side section of a first embodiment wherein the cathodes connected to the a.c. power source are provided in the first and last compartments.

The apparatus according to FIG. 1 consists of a main vacuum chamber 3, which is divided into a plurality of individual compartments 4–8, all of the compartments being connected to each other by a passageway 9, 10, at least certain sections of which are formed by conduits 26, 27. The first and last compartments 4, 8 are equipped with cathodes 11, 12, the two cathodes 11, 12 being connected by power supply lines 13, 14 to an a.c. power source 15, such as a medium-frequency generator. The second, third, and fourth compartments 5, 6, 7 are connected to separate vacuum pumps 16, 17, 18, and the first two compartments 4, 5 are connected to each other by opening 19 in the associated partition walls 21. Likewise, the last two compartments 7, 8 are connected to each other by opening 20 in partition wall 22. Compartments 4, 6, 8 are connected to gas feed lines 23, 23'; 24, 24'; 25, 25', through which process gas can be introduced into the individual compartments 4–8. During the coating process, substrate 2 is transported along passageway 9, 10 and through pipes or shafts 26, 27 and thus carried past the two cathodes 11, 12. The separation into individual compartments 4–8 makes it possible for the sputtering conditions for the two cathodes 11, 12 to be adjusted with great sensitivity.

Cathodes 11, 12, both of which are supplied from an a.c. current generator, are installed in compartments 4, 8, which are connected by openings 19, 20 to the adjacent compartments 5, 7, through which cathode compartments 4–8 are evacuated. Gas inlets 24, 24' supply the cathodes with reactive gas.

The apparatus shown in FIG. 1 and described above offers in particular the following advantages:

1. The installation of two standard high-power cathodes 11, 12 in separate compartments 4, 8, simplifies the design of a twin-magnetron cathode apparatus.

2. Because the compartments are separated from each other, cathodes 11, 12 can be operated in different sputtering atmospheres.

3. As a result of point 2, the working points of the two cathodes 11, 12 can be set, adjusted, and automatically controlled separately from each other.

4. It is possible to operate cathodes 11, 12 in metallic mode, that is, with little or no reactive gas; any reactive gas is introduced into a compartment between the cathodes. In this compartment, the deposited material can react with the reactive gas under the action of the plasma.

5. Because the cathodes 11, 12 are separated from each other, a very large plasma zone is created between the two cathodes. Without the need for any additional aids, a plasma band several meters long and as wide as the cathodes can be produced. Various treatments (etching, nitriding, surface activation, etc.) can be applied to substrates 2 in this plasma band.

6. Because of the considerable distance between the two cathodes 11, 12, it is much more difficult for a direct spark-over to occur. Thus, the stability of the process is increased.

7. On the way between the two cathodes 11, 12, pressure stages 5, 6, 7 are provided, which make it possible for the sputtering gas pressures in the two cathodes spaces 4, 8 and also in intermediate space 6 between the cathodes 11, 12 to be adjusted to different values.

8. As a result of the pressure stages according to point 7, it is also possible for cathodes 11, 12 to be operated with different types of gases or gas mixtures.

9. Substrate 2 can be transported through openings or shafts 26, 27 or passageways 9, 10, but it can also be transported through slot-type locks, isolated from the plasma.

10. The apparatus is suitable for conducting PECVD over large areas. The apparatus also offers advantages in the case of large-area plasma treatments, e.g., during the etching and degassing of substrates which have been transferred in through the lock. Finally, the degassing of a standard glass system is also possible during the initial pumping process, by igniting a medium-frequency plasma between the first and the last DC cathode of the overall system or between additional cathodes, preferably with a Ti target.

Figure 2:
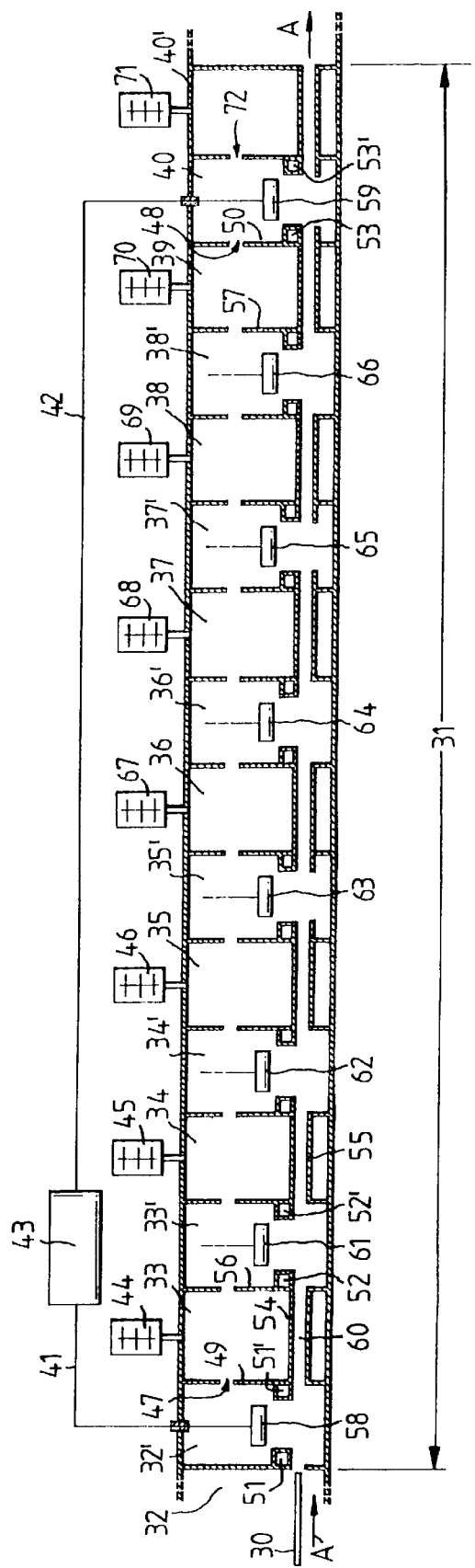
FIG. 2 is a schematic side section of a second embodiment wherein some of the compartments between the two compartments holding the cathodes connected to the a.c. power source are equipped with their own sputter cathodes.

The apparatus according to FIG. 2 consists of a main vacuum chamber 31, which is divided into a plurality of individual compartments 32, 32' . . . 39, 39'. All the compartments are connected to each other by means of a passageway 60, formed by conduits 54, 55, and the first and the next-to-last compartments 32, 39 are equipped with cathodes 58, 59. The two cathodes 58, 59 are connected by way of power supply lines 41, 42 to the poles of an a.c. power source 43, such as a medium-frequency generator. The individual compartments are connected to each other by openings 47, 48, in the associated partition walls 49, 50. The compartments 32–39 are provided with gas feed lines 51, 51'; 52 52'; . . . through which process gas can be introduced into the individual compartments 32–39. During the coating process, substrate 30 (e.g., a flat pane of glass) is transported along passageway 60 through the conduits 54, 55 and thus carried past the two cathodes 58, 59. The use of individual compartments makes it possible for the sputtering conditions for the two cathodes 58, 59 to be adjusted with great sensitivity.

Cathodes 58, 59, both of which are fed from the same a.c. current generator 43, are installed in compartments 32, 39, which are connected by openings 47, 48, 72 to adjacent compartments 32', 38', 39', through which the cathode compartments 32, 39 are evacuated. Compartments 33 to 40 are respectively provided with vacuum pumps 44 to 46 and 67 to 71. Gas inlets 51, 51'; 53, 53' supply cathodes 58, 59 with a process gas such as argon.

Cathodes 61–66 installed in respective compartments 33–38 are connected to power sources not shown in detail in the drawing. These can be sputter cathodes operated either with direct current or with alternating current at a medium frequency, for example.

In the case illustrated, the diagram shows a flat glass coating system, in which a pane of glass 30 passes through all the stations from left to right in the direction of arrow A and ultimately emerges at end of passageway 60 in the direction of arrow A. Cathodes 61–66 serve in this case exclusively to coat the glass, whereas cathodes 58, 59 supplied with alternating current are used to condition the pass-through system and remain turned off during the actual coating process itself.

Glass coating systems usually require about 8–10 hours for conditioning. This time is therefore lost in terms of production. Standard glow discharge devices for enhancing the desorption process have not been widely accepted, because they require additional electrodes in the space to be treated. During operation, a considerable amount of contamination thus occurs in this space. These additional electrodes then generate "tinsel" and other flaking-off phenomena.

The advantage of the present design is that, in the spaces where desorption is to take place with increased intensity, no additional installations are required. In addition, the plasma burns primarily in the area between the transport device and the bottom of the system, so that even the areas which normally escape the normal cleaning cycles are included.

Because of the intensity of the magnetron plasma, a very powerful desorption effect is brought about on all the interior surfaces of the coating system. The magnetron plasma has a charge carrier density about 10 times greater than that of the known DC glow-discharge cleaning plasmas. The constriction of the plasma typical of direct current does not occur at medium frequency. The plasma fills up the entire chamber 31. It is technically impossible—without auxiliary equipment—to ignite a DC magnetron discharge with this type of arrangement. A medium-frequency discharge, however, can be ignited easily.

In the case of a DC discharge, the cathode requires an anode. Thus, additional problems occur because either an additional electrode must be installed or the getter-sputter space can be present on only one side of the system.

The drawing shows a typical design of a glass coating system with several cathodes, each of which is installed in a separate compartment. Each cathode has its own gas inlet and distribution system. The cathode compartments 32–39 are evacuated by the adjacent pump compartments 32'–39'. FIG. 2 shows a variant, in which the first and last cathode 58, 59 of the system are connected to medium-frequency generator 43 to generate a plasma. For this purpose, they are separated from the associated DC power supplies (not shown). When the medium-frequency voltage is now applied to cathodes 58, 59, a plasma band forms which extends through the entire system. The intensity of the plasma in the various compartments can be varied by adjusting the gas inlets for the cathodes located between the two cathodes supplied with medium frequency. During conditioning, cathodes 58, 59 sputter the bottom part of compartment 31; it is also possible, however, to provide shielding plates underneath the two cathodes 58, 59. The shielding plates are later removed to prevent any unnecessary coating of this bottom area. A titanium target is recommended as the target for cathodes 58, 59.

What is claimed is:

1. Apparatus for coating a substrate, said apparatus comprising:

a vacuum chamber comprising a plurality of compartments serially arranged and connected to each other by a passageway for passing a substrate through said compartments, a pair of magnetron cathodes located in a respective pair of said compartments, each cathode bearing a target to be sputtered, the substrate being transported along said passageway and being carried past said pair of magnetron cathodes;

an alternating power supply having poles connected to respective said cathodes; and means for introducing a process gas into said compartments in which said magnetron cathodes are located, wherein said compartments in which said magnetron cathodes are located have a plurality of intermediate compartments therebetween, said passageway comprising a closed conduit passing through said intermediate compartments adjacent to said cathodes, said intermediate compartments adjacent to said compartments in which said magnetron cathodes are located are connected to said compartments in which said magnetron cathodes are located by partitions having holes therein, and further having at least one additional sputtering cathode in at least one of said intermediate compartments, said passageway through said at least one of said intermediate compartments being open toward said additional sputtering cathode therein.

2. Apparatus as in claim 1 wherein said intermediate compartments comprise three compartments including a central compartment having means for introducing a reactive gas therein.

3. Apparatus as in claim 1 further comprising vacuum pumps connected at least to said intermediate compartments adjacent to said compartments in which said magnetron cathodes are located.

\* \* \* \* \*

UNITED STATES PATENT AND TRADEMARK OFFICE
CERTIFICATE OF CORRECTION

PATENT NO.    : 6,168,698 B1
DATED         : January 2, 2001
INVENTOR(S)   : Szczyrbowski et al.

It is certified that error appears in the above-identified patent and that said Letters Patent is hereby corrected as shown below:

Title page, Foreign Patent Documents,
Insert --
| | | |
|---|---|---|
| 4237517 | 5/1994 | (DE) |
| 0544107 | 6/1993 | (EP) |
| 0502242 | 9/1992 | (EP) |
| 4239843 | 6/1994 | (DE) |
| 0510401 | 10/1992 | (EP) |
| 4326100 | 2/1995 | (DE) --. |

Column 4,
Line 34, after "evacuated." insert -- Compartments 33 to 40 are respectively provied with vacuum pumps 44 to 46 and 67 to 77. --.

Signed and Sealed this

Fourteenth Day of August, 2001

Attest:

NICHOLAS P. GODICI
Attesting Officer    Acting Director of the United States Patent and Trademark Office